(12) United States Patent
Khoury et al.

(10) Patent No.: US 12,557,436 B2
(45) Date of Patent: Feb. 17, 2026

(54) SUBSTRATE PROCESSING FOR GaN GROWTH

(71) Applicant: Applied Materials, Inc., Santa Clara, CA (US)

(72) Inventors: Michel Khoury, Mountain View, CA (US); Ria Someshwar, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/507,134

(22) Filed: Oct. 21, 2021

(65) Prior Publication Data

US 2023/0117013 A1    Apr. 20, 2023

Related U.S. Application Data

(60) Provisional application No. 63/255,825, filed on Oct. 14, 2021.

(51) Int. Cl.
*H10H 20/01*    (2025.01)
*H10H 20/825*   (2025.01)
*H10H 20/812*   (2025.01)

(52) U.S. Cl.
CPC ...... *H10H 20/01335* (2025.01); *H10H 20/01* (2025.01); *H10H 20/825* (2025.01); *H10H 20/812* (2025.01)

(58) Field of Classification Search
None
See application file for complete search history.

(56) References Cited

U.S. PATENT DOCUMENTS

| 2001/0049201 | A1  | 12/2001 | Park |
| 2007/0259534 | A1* | 11/2007 | Reid ............... C23C 16/303 438/783 |
| 2010/0087045 | A1* | 4/2010  | Shimomura ....... H01L 27/1218 438/455 |
| 2011/0162706 | A1* | 7/2011  | Borden ........... H01L 31/03682 257/E31.119 |
| 2014/0346541 | A1  | 11/2014 | Hertkorn et al. |
| 2015/0076507 | A1* | 3/2015  | Hertkorn ......... H01L 21/02488 438/479 |

(Continued)

FOREIGN PATENT DOCUMENTS

| CN | 101471245 A | 7/2009 |
| CN | 104201196 A | 12/2014 |

(Continued)

OTHER PUBLICATIONS

Gold Nitride: Preparation and Properties (Year: 2009).*

(Continued)

*Primary Examiner* — Bradley Smith
(74) *Attorney, Agent, or Firm* — Kilpatrick Townsend & Stockton LLP

(57) ABSTRACT

Exemplary semiconductor structures may include a silicon-containing substrate. The structures may include a layer of a metal nitride overlying the silicon-containing substrate. The structures may include a gallium nitride structure overlying the layer of the metal nitride. The structures may include an oxygen-containing layer disposed between the layer of the metal nitride and the gallium nitride structure.

13 Claims, 4 Drawing Sheets

(56) References Cited

U.S. PATENT DOCUMENTS

| | | | |
|---|---|---|---|
| 2015/0187985 A1* | 7/2015 | Hertkorn | H01L 21/0242 |
| | | | 257/98 |
| 2015/0279672 A1 | 10/2015 | Hyot et al. | |
| 2017/0005223 A1 | 1/2017 | Bergbauer et al. | |
| 2017/0054025 A1 | 2/2017 | Dargis et al. | |
| 2017/0110630 A1 | 4/2017 | Kawakami et al. | |
| 2017/0229611 A1 | 8/2017 | Shatalov et al. | |
| 2017/0278961 A1 | 9/2017 | Hill et al. | |
| 2017/0338110 A9 | 11/2017 | Kumar | |
| 2019/0249328 A1 | 8/2019 | D'evelyn et al. | |
| 2020/0083167 A1* | 3/2020 | LaRoche | H01L 29/475 |
| 2021/0009461 A1* | 1/2021 | Sayce | C01B 33/12 |
| 2021/0210651 A1 | 7/2021 | Bergbauer et al. | |

FOREIGN PATENT DOCUMENTS

| | | | | |
|---|---|---|---|---|
| CN | 113044816 A | * | 6/2021 | C01B 21/0728 |
| CN | 113224155 A | | 8/2021 | |
| CN | 113540295 A | | 10/2021 | |
| TW | 558843 B | | 10/2003 | |
| TW | I257142 B | | 6/2006 | |
| TW | 201624685 A | | 7/2016 | |
| WO | WO-2015013746 A1 | * | 2/2015 | H01L 41/331 |
| WO | 2017129481 A1 | | 8/2017 | |
| WO | 2020186205 A1 | | 9/2020 | |

OTHER PUBLICATIONS

Application No. PCT/US2022/045974, International Search Report and the Written Opinion, Mailed On Feb. 7, 2023, 9 pages.

Application No. PCT/US2022/045976, International Search Report and the Written Opinion, Mailed On Feb. 3, 2023, 12 pages.

English Translation of CN 113540295 A, published Oct. 22, 2021, 27 pages.

U.S. Appl. No. 17/696,447, Final Office Action, Mailed On Feb. 10, 2025, 16 pages.

U.S. Appl. No. 17/696,447 , Non-Final Office Action, Mailed On May 30, 2025, 18 pages.

Application No. EP22881585.8 , Extended European Search Report, Mailed On Jul. 4, 2025, 9 pages.

Application No. TW113145658 , Office Action, Mailed On Jun. 30, 2025, 10 pages.

Chaaben et al., "High Resolution X-ray Diffraction of GaN Grown on Si (1 1 1) by MOVPE", Applied Surface Science, vol. 253, No. 1, Jul. 10, 2006, pp. 241-245.

Application No. EP22881584.1 , Extended European Search Report, Mailed On Oct. 6, 2025, 9 pages.

* cited by examiner

SUBSTRATE PROCESSING FOR GaN GROWTH

CROSS-REFERENCE TO RELATED APPLICATIONS

This application claims the benefit of priority to U.S. Provisional Patent Application No. 63/255,825, filed 14 Oct. 2021, and which is hereby incorporated by reference in its entirety for all purposes.

TECHNICAL FIELD

The present technology relates to semiconductor processing and materials. More specifically, the present technology relates to formation processes and materials for light-emitting diode structures and components.

BACKGROUND

LED panels or devices may be formed with a number of light sources that operate as pixels on the device. The pixels may be formed with monochromatic light sources that are then delivered through a conversion layer to produce color, or the pixels may each have individual color light sources formed. In either scenario, any number up to millions of light sources may be formed and connected for operation. While there have been considerable developments to light sources used in LED panels, producing the structures may still be prone to defects causing reduced performance.

Thus, there is a need for improved systems and methods that can be used to produce high quality devices and structures. These and other needs are addressed by the present technology.

SUMMARY

Exemplary semiconductor structures may include a silicon-containing substrate. The structures may include a layer of a metal nitride overlying the silicon-containing substrate. The structures may include a gallium nitride structure overlying the layer of the metal nitride. The structures may include an oxygen-containing layer disposed between the layer of the metal nitride and the gallium nitride structure. The oxygen-containing layer may include two or more of aluminum, oxygen, gallium, or nitrogen.

In some embodiments, the silicon-containing substrate may be or include silicon. The metal nitride may be selected from the group including or consisting of aluminum nitride, hafnium nitride, and niobium nitride. The oxygen-containing layer may include aluminum and oxygen. The oxygen-containing layer may include gallium. The oxygen-containing layer include nitrogen.

Some embodiments of the present technology may encompass methods of semiconductor processing. The methods may include forming a seed layer of a metal nitride material on a substrate. The methods may include annealing the seed layer for a period of time. The methods may include exposing the seed layer to an acid. The methods may include forming a gallium-containing material on the seed layer. Annealing the seed layer may include an anneal at a temperature of greater than or about 1000° C. The period of time may be greater than or about 60 minutes. The seed layer may include a nitride of aluminum, hafnium, or niobium. The seed layer may include a nitride formed by physical vapor deposition. Exposing the seed layer to an acid may include contacting the seed layer with a halogen-containing wet etchant. The methods may include, prior to exposing the seed layer to an acid, transferring the substrate to an oxygen-containing environment. The methods may include forming an oxide layer overlying the seed layer. Exposing the seed layer to an acid may maintain an amount of an oxygen-containing material overlying the seed layer. The gallium-containing material may be formed overlying the oxygen-containing material. The gallium-containing material may include gallium nitride. The gallium-containing material may be characterized by a dislocation density of less than or about 7E9/cm$^2$.

Some embodiments of the present technology may encompass methods of semiconductor processing. The methods may include forming a seed layer of a metal nitride material on a silicon substrate. The methods may include generating a plasma of an oxygen-containing precursor. The methods may include contacting the seed layer with plasma effluents of the oxygen-containing precursor to form a layer of an oxygen-containing material. The methods may include forming a gallium-containing material on the oxygen-containing material.

In some embodiments, the methods may include, prior to generating the plasma of the oxygen-containing precursor, exposing the seed layer to a wet etchant. The seed layer may be contacted with the plasma effluents for a period of time greater than or about 5 minutes. The seed layer may be formed by physical vapor deposition. The oxygen-containing material may include two or more of oxygen, aluminum, and nitrogen. The metal nitride material may include one or more of aluminum, hafnium, or niobium. The gallium-containing material may be gallium nitride.

Such technology may provide numerous benefits over conventional systems and techniques. For example, the present technology may provide methods of forming gallium-containing materials characterized by reduced dislocations or defects extending through the materials. Additionally, the present technology may afford the ability to utilize physical vapor deposition to produce seed layers for growing gallium-nitride materials. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
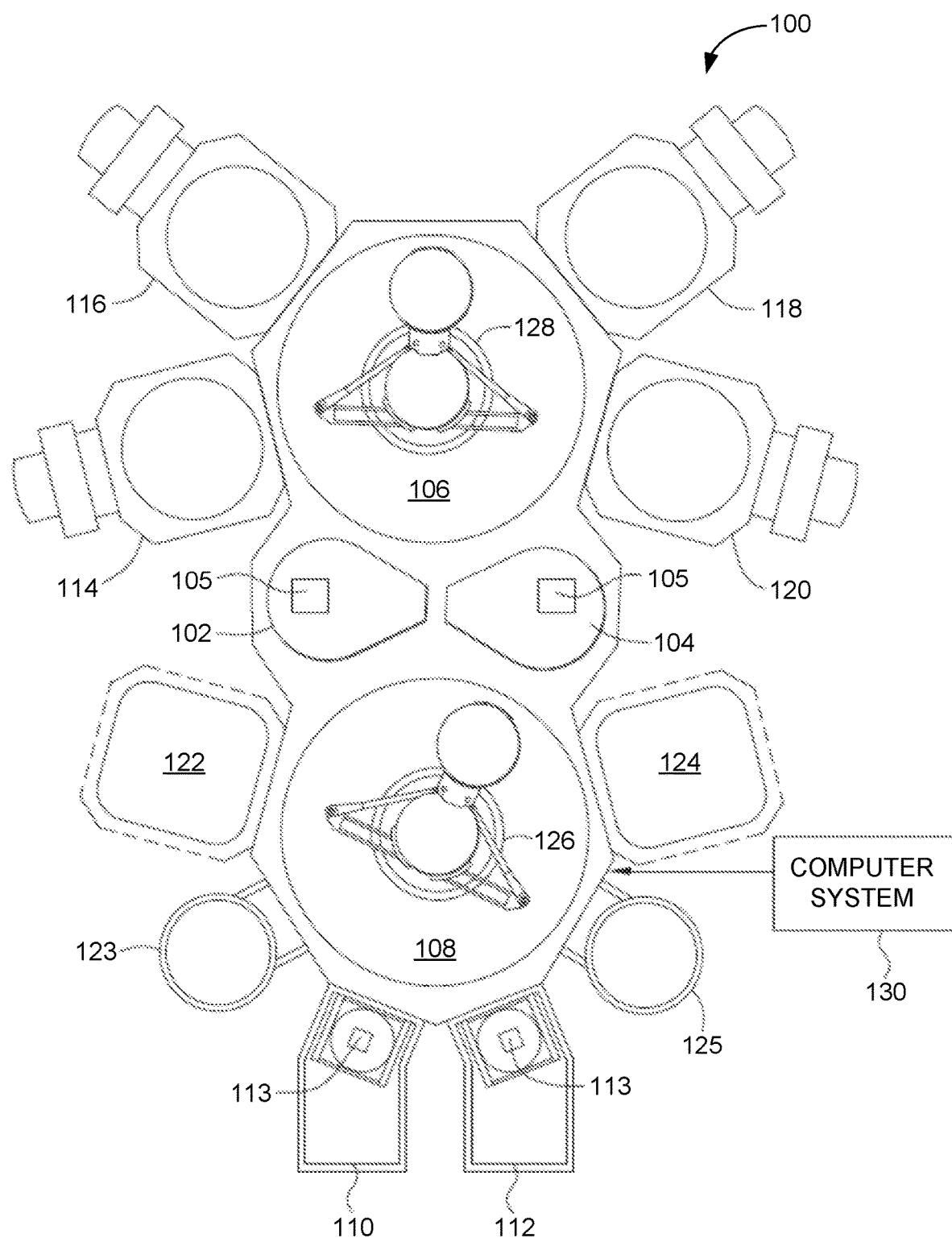
FIG. 1 shows a top plan view of one embodiment of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

LEDs may include semiconductor structures that emit light when current flows through the structure. Electrons in the semiconductor may recombine with electron holes, releasing energy in the form of photons. Many conventional LEDs are formed with a thick film, such as thicker than a micron, that may define quantum wells. Dislocations, such as threading dislocations or defects, may propagate through the material in the quantum well, such as from the underlying substrate, and may result in non-radiative recombination in the quantum well region, where the LED emits a phonon instead of a photon. Threading dislocations in conventional technologies may readily pass through to the surface of the quantum well, which may undesirably increase the non-radiative recombination. These dislocations may form or exist due to a number of aspects related to the growth or structural formation process, and the dislocations may carry through the subsequent device layers formed, including the LED active region, which may further reduce the efficiency of the device.

Conventional technologies may utilize complex and expensive processing operations to develop the quantum well material in an attempt to reduce dislocations, and may be limited to specific materials and processes for the structure. For example, metal-oxide chemical vapor deposition may be used to form both a seed layer over a substrate, as well as the subsequent material used for the quantum well. This process may be expensive and time consuming. However, conventional technologies have been incapable of utilizing alternative techniques to produce the seed layer, and dislocation density may still be unfavorably high. For example, physical vapor deposition may produce films characterized by reduced structural or film characteristics, which may prevent adequate growth of the quantum well material. As one non-limiting example, gallium nitride may be used as the quantum well material in some devices, and conventional technologies have been unable to grow this material on metal nitride seed layers produced by physical vapor deposition, which may be characterized by more poorly oriented crystal structures. Because of the structure of the metal nitride produced, the polar gallium nitride material may form crystals characterized by mixed polarity, with regions of gallium-polar growth and regions of nitrogen-polar growth. This may prevent the structure from appropriately coalescing to form a quantum well, and the device may fail.

The present technology may overcome issues associated with conventional technologies, and may cure or otherwise overcome the previous limitations of physical vapor deposition nitride materials. By performing one or more treatments on a physical vapor deposition seed layer, an oxygen interface may be produced, which may facilitate improved growth of gallium-containing materials. Accordingly, dislocations or defects may be controlled or minimized, which may improve device quality and performance. Although the remaining disclosure will routinely identify specific LED materials and processes utilizing the disclosed technology, it will be readily understood that the systems and methods are equally applicable to a variety of materials and processes as may occur for producing displays. Accordingly, the technology should not be considered to be so limited as for use with LED processes alone. After discussing an exemplary chamber system that may be used according to some embodiments of the present technology, methods for producing high-quality structures will be described.

FIG. 1 illustrates a top plan view of a multi-chamber processing system 100, which may be specifically configured to implement aspects or operations according to some embodiments of the present technology. The multi-chamber processing system 100 may be configured to perform one or more fabrication processes on individual substrates, such as any number of semiconductor substrates, for forming semiconductor devices. The multi-chamber processing system 100 may include some or all of a transfer chamber 106, a buffer chamber 108, single wafer load locks 110 and 112, although dual load locks may also be included, processing chambers 114, 116, 118, 120, 122, and 124, preheating chambers 123 and 125, and robots 126 and 128. The single wafer load locks 110 and 112 may include heating elements 113 and may be attached to the buffer chamber 108. The processing chambers 114, 116, 118, and 120 may be attached to the transfer chamber 106. The processing chambers 122 and 124 may be attached to the buffer chamber 108. Two substrate transfer platforms 102 and 104 may be disposed between transfer chamber 106 and buffer chamber 108, and may facilitate transfer between robots 126 and 128. The platforms 102, 104 can be open to the transfer chamber and buffer chamber, or the platforms may be selectively isolated or sealed from the chamber to allow different operational pressures to be maintained between the transfer chamber 106 and the buffer chamber 108. Transfer platforms 102 and 104 may each include one or more tools 105, such as for orientation or measurement operations.

The operation of the multi-chamber processing system 100 may be controlled by a computer system 130. The computer system 130 may include any device or combination of devices configured to implement the operations described below. Accordingly, the computer system 130 may be a controller or array of controllers and/or a general purpose computer configured with software stored on a non-transitory, computer-readable medium that, when executed, may perform the operations described in relation to methods according to embodiments of the present technology. Each of the processing chambers 114, 116, 118, 120, 122, and 124 may be configured to perform one or more process steps in the fabrication of a semiconductor structure. More specifically, the processing chambers 114, 116, 118, 120, 122, and 124 may be outfitted to perform a number of substrate processing operations including dry etch processes, cyclical layer deposition, atomic layer deposition, chemical vapor deposition, physical vapor deposition, etch, pre-clean, degas, orientation, among any number of other substrate processes.

Figure 2:
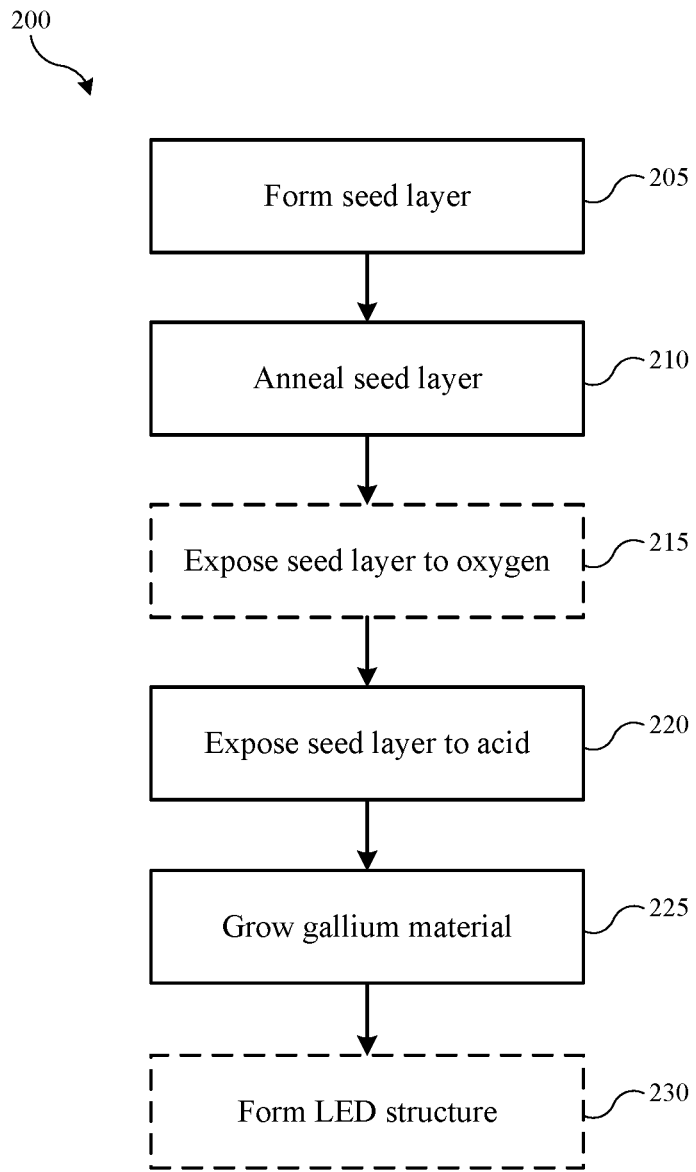
FIG. 2 shows selected operations in a method of forming a semiconductor structure according to some embodiments of the present technology.

FIG. 2 illustrates selected operations of a semiconductor processing method 200. Method 200 may include one or more operations prior to the initiation of the method, including front end processing, deposition, etching, polishing, cleaning, or any other operations that may be performed prior to the described operations. For example, in some embodiments a degas or other preparatory operation may be performed on a substrate, such as silicon or sapphire substrate, to prepare the substrate for deposition. The method may include a number of optional operations, which may or may not be specifically associated with some embodiments of methods according to the present technology. For example, many of the operations are described in order to provide a broader scope of the structural formation, but are not critical to the technology, or may be performed by alternative methodology as will be discussed further below. Method 200 describes operations shown schematically in FIGS. 3A-3C, the illustrations of which will be described in conjunction with the operations of method 200. It is to be understood that the figures illustrate only partial schematic views, and a substrate may contain any number of sections having aspects as illustrated in the figures, as well as alternative structural aspects that may still benefit from aspects of the present technology.

Figure 3A:
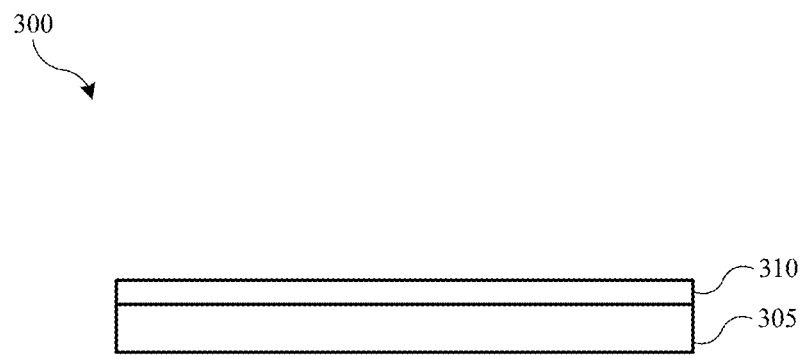
FIGS. 3A-3C illustrate schematic views of a device developed according to some embodiments of the present technology.

Method 200 may involve optional operations to develop the structure to a particular fabrication operation. As illustrated in FIG. 3A, a substrate 305 may be used to facilitate formation of a number of structures utilized in LED formation or other semiconductor processing. Although only two aspects are illustrated, it is to be understood that a substrate may have hundreds, thousands, millions, or more aspects, and which may be of any size. Substrate 305 may be any substrate on which structures may be formed, such as silicon-containing materials, aluminum materials, including sapphire, or any other materials as may be used in display or semiconductor fabrication. The substrate 305 may have various dimensions, such as 200 mm or 300 mm diameter wafers, as well as rectangular or square panels. The substrate 305 may be cleaned or processed in preparation for depositing one or more layers of material on the substrate for producing a structure, such as an LED, for example, although any number of other semiconductor structures may similarly benefit from aspects of the present technology.

A nitrogen-containing nucleation or seed layer 310 may be formed overlying the substrate 305 at operation 205. Although the remaining disclosure will regularly discuss formation on or with an aluminum nitride seed layer, it is to be understood that the technology is not so limited. In some embodiments, the seed layer may be or include gallium nitride, niobium nitride, hafnium nitride, aluminum nitride, or any other metal nitride on which gallium-containing materials or other materials may be formed. Seed layer 310 may be formed in any number of ways, such as by metal-oxide chemical vapor deposition, although in some embodiments, the seed layer may be formed by physical vapor deposition.

As noted above, conventional technologies have been incapable of utilizing physical vapor deposition for seed layer formation because the produced material is typically characterized by disorientation of the structure. Physical vapor deposition formation of the seed layer may provide unfavorable kinetics for gallium nitride growth, which may lead to any number of issues. The interface produced between the seed layer and subsequently formed gallium materials facilitates greater transmission of defects, as well as production of mixed polarity gallium nitride, which may detrimentally reduce efficiency and quality of the quantum well. Accordingly, conventional technologies have been constrained to utilizing more expensive technologies, such as e-beam or metal-oxide chemical vapor deposition. The present technology may overcome these issues by performing one or more techniques that may create a beneficial interface where an oxygen-containing material is formed, which may allow an improved growth of gallium-containing materials, such as gallium nitride.

For example, method 200 may include annealing the seed layer at operation 210. The anneal may be performed at high temperatures, which may improve the crystalline structure of the nitride seed layer, including at an exposed surface, and which may help to reduce or limit transmission of dislocations through the subsequently formed layers, and may facilitate improved growth of gallium materials. The anneal may be performed at a temperature of greater than or about 1,000° C., and may be performed at a temperature of greater than or about 1,150° C., greater than or about 1,200° C., greater than or about 1,250° C., greater than or about 1,300° C., greater than or about 1,350° C., greater than or about 1,400° C., greater than or about 1,450° C., greater than or about 1,500° C., greater than or about 1,550° C., greater than or about 1,600° C., or higher. However, depending on the substrate material, a lower temperature may be used, which may facilitate treatment of the nitride seed layer, but may protect the substrate. For example, in some embodiments, the substrate may be silicon, which may be damaged or melt at higher temperatures. Accordingly, in some embodiments, and depending on the substrate, the temperature may be maintained at less than or about 1,500° C., and may be maintained at less than or about 1,400° C., less than or about 1,300° C., or less.

The anneal may be performed for a period of time sufficient to improve the seed layer, and the anneal may be performed for greater than or about 30 minutes, greater than or about 60 minutes, greater than or about 90 minutes, greater than or about 120 minutes, greater than or about 150 minutes, greater than or about 180 minutes, or more. The time period may be related to the anneal temperature, where a higher temperature anneal may be performed for a reduced period of time, while producing similar effects. For example, while an anneal at 1,600° C. may be performed for a time period of less than or about 30 minutes, an anneal performed at a temperature of less than or about 1,200° C. may be performed for greater than or about 90 minutes. The anneal may be performed in any processing atmosphere, but in some embodiments the anneal may be performed in an inert atmosphere, such as a nitrogen atmosphere, an argon atmosphere, a helium atmosphere, among other non-reactive, oxygen-deprived, or other inert materials.

Figure 3B:
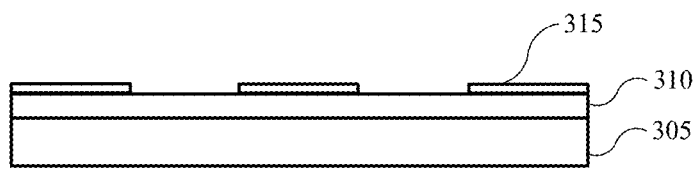

Subsequent to the anneal operation, in some embodiments the substrate with the annealed seed layer may be exposed to an oxygen-containing environment, such as by passing the substrate from a vacuum environment at optional operation 215. For example, a wet-etch chamber coupled with a side of a factory interface module, or on a different mainframe, may allow the substrate to be exposed to an oxygen-containing atmosphere. This may allow an amount of oxide to form on the seed layer, or may oxidize aspects of the seed layer. As shown in FIG. 3B, oxidation 315 may be formed overlying the seed layer. At operation 220, the seed layer and overlying oxidation region may be exposed to an acid, such as in a dip or other wet etch process. For example, in some embodiments the seed layer may be exposed to a halogen-containing wet etchant, such as a diluted hydrogen fluoride, as one non-limiting example. While the wet etchant may cause an amount of etching to be performed of the oxidation, in some embodiments an oxygen-containing material may be retained at least partially across the surface of the seed layer. This exposure may cause any number of effects to the oxide material, such as removing lower quality oxygen-containing material, or oxidation characterized by specific crystalline structures, while maintaining other oxide materials.

Figure 3C:
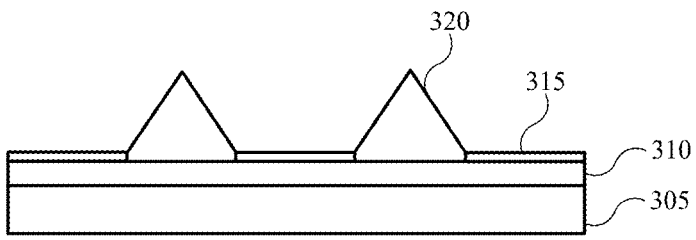

In embodiments where the substrate may be removed from a vacuum environment, the substrate may be delivered back to a processing environment, where a gallium-containing material may be grown at operation 225. The gallium-containing material, which may include gallium nitride, for example, may be grown by metal-oxide chemical vapor deposition, or by any other deposition or formation process. As shown in FIG. 3C, the gallium-containing material 320 may be characterized by discrete regions of a pyramidal shaped structure, although the process may facilitate growth of any structure including a continuous layer of gallium-containing material. The gallium-containing material may be grown overlying the oxide material remaining overlying the seed layer, which may facilitate growth of the gallium-containing material. By maintaining an amount of oxidation, and which may have been exposed to acid as previously noted, gallium nitride may be grown, which may be characterized by reduced dislocations extending through the materials. This may be due to increased or faster coalescing of the gallium nitride material, which may trap dislocations or defects closer to the seed layer, and which may not extend through the quantum well materials.

The structure produced may be characterized by an oxygen-containing layer disposed between the seed layer, such as a layer of a metal nitride as previously described, and the gallium-containing material, such as gallium nitride, for example. By incorporating an oxygen-containing layer, gallium nitride growth may occur with a more metal-polar characteristic, and with reduced defects. The oxygen-containing layer may be characterized by any number of elements incorporated in one or more crystal structures. For example, the oxygen-containing layer may include one or more of aluminum, oxygen, gallium, or nitrogen. The layer may also be characterized by any number of crystal structures, which may improve the growth characteristics of gallium nitride. For example, gallium nitride may be characterized by a hexagonal crystal structure, which may show improved growth on more similar crystal structures. As one non-limiting example, gallium nitride may show improved growth on sapphire-like aluminum oxide, which may be in part due to the hexagonal crystal structure of sapphire. Accordingly, by exposing the oxidation layer to acid, certain oxide structures may be altered or removed, which may allow to remain oxide structures that may facilitate growth of gallium nitride that may be characterized by improved and earlier coalescence, and which may reduce dislocations through the material.

Oxide materials that may remain may include any of the elements noted above, and may have at least some regions characterized by a more aluminum oxide nature, which may be characterized by one or more crystalline structures. For example, oxide material that may be formed by the oxidation may be characterized by any number of aluminum oxide crystal structures, such as alpha-aluminum oxide, gamma-aluminum oxide, delta-aluminum oxide, theta-aluminum oxide, iota-aluminum oxide, kappa-aluminum oxide, or sigma-aluminum oxide. The formation may produce any number of lattice parameters of any of these materials, and may provide any number of crystal structures. For example the oxide or material formed may be characterized by features that may relate to a hexagonal crystal structure, a cubic crystal structure, a tetragonal crystal structure, a monoclinic crystal structure, and/or an orthorhombic crystal structure. The exposure to acid may also allow the oxide to form openings exposing regions of the aluminum nitride, which may allow gallium nitride to form through the opening pattern of the oxide layer. This may allow improved and controlled growth of gallium nitride, allowing the crystals to more quickly coalesce locally at each section, such as sections 320, and which may reduce propagation of dislocations from the seed layer through the quantum well or gallium-containing material.

By performing treatments according to some embodiments of the present technology, dislocation density through the gallium-containing material may be reduced. For example, the present technology may produce regions of gallium nitride of any thickness, such as from dozens of nanometers to several micrometers or more, and which may be characterized by a dislocation density of less than or about $8.0E9/cm^2$, and which may be characterized by a dislocation density of less than or about $7.5E9/cm^2$, less than or about $7.0E9/cm^2$, less than or about $6.5E9/cm^2$, less than or about $6.0E9/cm^2$, less than or about $5.5E9/cm^2$, less than or about $5.0E9/cm^2$, or less. This may improve efficiency of operation, and may improve device performance.

After forming the gallium-nitride material, method 200 may further include forming an LED structure at optional operation 230, such as in embodiments in which the gallium-nitride material may be used as a quantum well for an LED structure. Embodiments of forming an LED structure may include forming a p-doped layer over the gallium-containing material. The p-doped layer may be made from one or more of gallium nitride, aluminum-indium-gallium-nitride, indium-gallium-nitride, and aluminum-gallium nitride. In some embodiments, the p-doped layer may include gallium-free, indium-and-nitride materials such as indium nitride, and aluminum-indium-nitride, among other gallium-free nitride materials. Forming the LED structure may additionally include forming contact pads on the layers of the structure. The contact pads may be formed of one or more electrically conductive materials such as copper, aluminum, tungsten, chromium, nickel, silver, gold, platinum, palladium, titanium, tin, and/or indium, among other conductive materials. Any additional or alternative operations or processes for forming an LED structure may be included, as one of skill would appreciate.

The LED formation may also include forming a light conversion region on the LED structure. The light conversion region may absorb the light emitted by the LED structure and emit light at a longer wavelength from an LED display. In some embodiments, the light conversion region may be a quantum-dot layer, which may be operable to convert a shorter wavelength of light from the LED structure into one of red, green, or blue light. Additional quantum-dot layers may be formed on other LED structures to convert the shorter wavelength of light emitted by the LED structure into another of the red, green, and blue colored light. In some embodiments, combinations of three quantum-dot layers on three LED structures may form an LED pixel that includes subpixels operable to emit red, green, and blue light. In some embodiments, sequential operations may form a red quantum dot layer in one of the subpixels of each LED pixel, a green quantum dot layer in another one of the subpixels, and a blue quantum dot layer in still another one of the subpixels. Following the formation of the blue quantum dot, each LED pixel in the array of LED pixels may include red, green, and blue subpixels.

Figure 4:
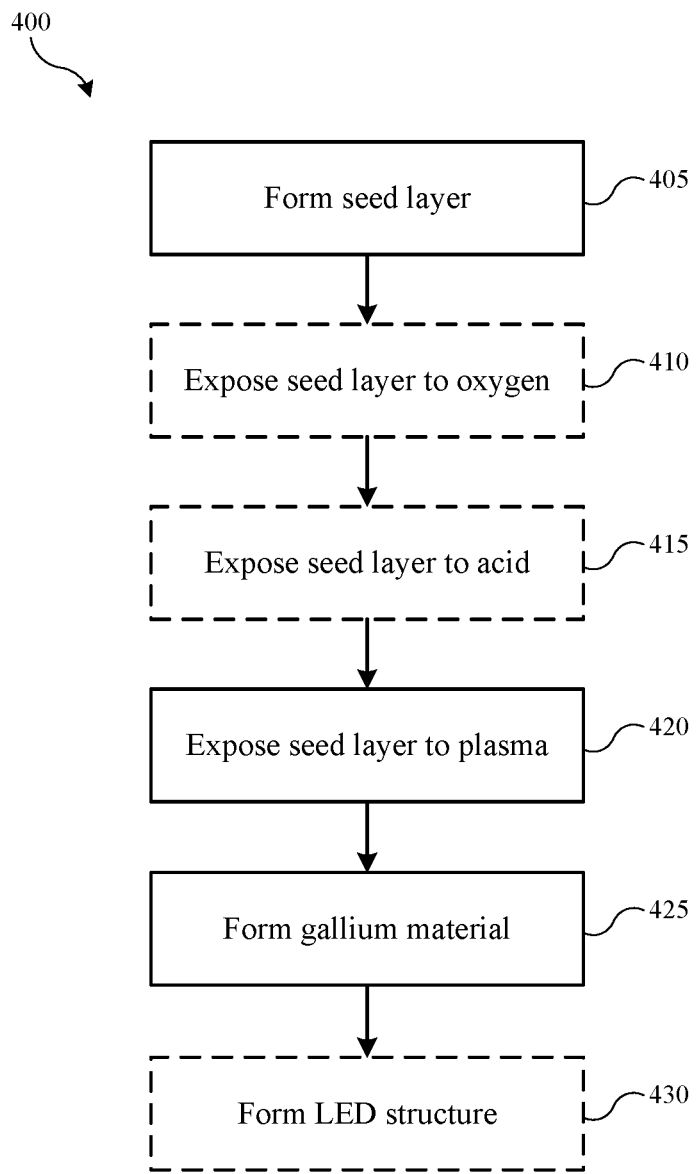
FIG. 4 shows selected operations in a method of forming a semiconductor structure according to some embodiments of the present technology.

The present technology may also encompass formation of oxygen-containing layers as previously described, which may be produced by additional or alternative methods. FIG. 4 illustrates selected operations of a semiconductor processing method 400. Method 400 may include any process or operation as previously described with respect to method 200, and method 400 may be used to produce any structure as discussed above or illustrated in the previous figures. Method 400 may additionally or alternatively utilize a plasma processing operation to form an oxygen-containing region, and which may or may not utilize a break in vacuum as previously described.

For example, method 400 may include formation of a seed layer at operation 405, such as a nitride of any metals previously described, and which may be produced by physical vapor deposition in some embodiments. In some embodiments, the process may include exposing the substrate and seed layer to oxygen at optional operation 410, such as by removing the substrate from the vacuum environment. The substrate may be exposed to acid at optional operation 415, such as previously described, and then may be delivered back to the vacuum environment for further processing. At operation 420, the method may include exposing the seed layer to an oxygen-containing plasma. Although method 400 is shown with the oxygen plasma exposure occurring subsequent to the optional acid exposure, in some embodiments the optional operations 410 and 415 may be performed subsequent to the exposure to plasma.

During the plasma exposure, oxygen radicals or plasma effluents may be generated and delivered to the substrate. The plasma effluents may contact the seed layer and form an oxygen-containing layer or material regions as previously described. The exposure may incorporate oxygen into the structure being developed, and may produce a layer including any of the features, properties, aspects, or characteristics as previously described for an oxygen-containing material, and which may include any of the elements previously noted. The process may include generation of oxygen plasma either locally or remotely from a processing region in which a substrate is disposed. The plasma may be generated from any oxygen-containing material such as diatomic oxygen, ozone, nitrous oxide, nitric oxide, or any other oxygen-containing material, and in some embodiments ozone may be used with or without plasma generation. The seed layer may be exposed to oxygen radical species or plasma effluents for a period of time greater than or about 5 minutes, and may be exposed for greater than or about 10 minutes, greater than or about 15 minutes, greater than or about 20 minutes, greater than or about 25 minutes, greater than or about 30 minutes, or more. This may produce an oxygen-containing material at the surface of the seed layer as previously described, and which may produce a more metal-polar gallium-containing material. At operation 425, a gallium-containing material may be formed over the oxygen-containing layer, which may be a gallium nitride material formed as previously described. In some embodiments, an LED structure may be formed at optional operation 430 as previously described.

Embodiments of the present technology include operations and structures that reduce or limit the amount of threading dislocations extending through the quantum well, which may otherwise reduce efficiency and performance of the resulting structure. By treating seed layers and forming an oxygen-containing structure as described above, the present technology may allow improved gallium-containing material growth, which may limit the prevalence and extension of dislocations through the materials. Accordingly, embodiments of the present technology may provide fabrication methods and resulting structures characterized by reduced amounts of threading dislocation for the improved efficiency of light-emitting diodes or other semiconductor structures.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either limit of the range, both limits of the range, or neither limit of the range are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A method of semiconductor processing comprising:
    forming a seed layer of a metal nitride on a substrate, wherein the seed layer is formed by physical vapor deposition, and the metal nitride is selected from the group consisting of aluminum nitride, hafnium nitride, and niobium nitride;
    annealing the seed layer at a temperature of greater than or about 1000° C. for a period of time greater than or about 60 minutes;
    exposing the seed layer to an acid; and
    forming a gallium-containing material on the seed layer.

2. The method of semiconductor processing of claim 1, wherein the seed layer comprises a nitride of aluminum, hafnium, or niobium.

3. The method of semiconductor processing of claim 1, wherein exposing the seed layer to the acid comprises:
    contacting the seed layer with a halogen-containing wet etchant.

4. The method of semiconductor processing of claim 3, further comprising:
    prior to exposing the seed layer to the acid, transferring the substrate to an oxygen-containing environment; and
    forming an oxide layer overlying the seed layer.

5. The method of semiconductor processing of claim 4, wherein exposing the seed layer to the acid maintains an amount of an oxygen-containing material overlying the seed layer, and wherein the gallium-containing material is formed overlying the oxygen-containing material.

6. The method of semiconductor processing of claim 1, wherein the gallium-containing material comprises gallium nitride.

7. The method of semiconductor processing of claim 1, wherein the gallium-containing material is characterized by a dislocation density of less than or about $7E9/cm^2$.

8. A method of semiconductor processing comprising:
forming a seed layer of a metal nitride on a substrate, wherein the metal nitride is selected from the group consisting of aluminum nitride, hafnium nitride, and niobium nitride;
subsequent to forming the seed layer, annealing the seed layer for a period of time;
exposing the substrate to an oxygen-containing environment;
forming an oxide layer overlying the seed layer in the oxygen-containing environment;
exposing the seed layer to an acid after forming the oxide layer; and
forming a gallium-containing material on the seed layer.

9. The method of semiconductor processing of claim 8, wherein annealing the seed layer comprises an anneal at a temperature of greater than or about 1000° C. and wherein the period of time is greater than or about 60 minutes.

10. The method of semiconductor processing of claim 8, wherein the seed layer comprises a nitride of aluminum, hafnium, or niobium.

11. The method of semiconductor processing of claim 8, wherein the seed layer is formed by physical vapor deposition.

12. The method of semiconductor processing of claim 8, wherein exposing the seed layer to the acid comprises:
contacting the seed layer with a halogen-containing wet etchant; and
maintaining an amount of an oxygen-containing material overlying the seed layer, wherein the gallium-containing material is formed overlying the oxygen-containing material.

13. The method of semiconductor processing of claim 8, wherein the gallium-containing material is characterized by a dislocation density of less than or about $7E9/cm^2$.

* * * * *